March 22, 1966 W. G. KLEHM, JR 3,242,384

CIRCUIT MODULE

Filed Oct. 24, 1963

INVENTOR.
WILLIAM G. KLEHM, JR.

3,242,384
CIRCUIT MODULE

William G. Klehm, Jr., Farmington, Mich., assignor to Burroughs Corporation, Detroit, Mich., a corporation of Michigan Filed Oct. 24, 1963, Ser. No. 318,589
4 Claims. (Cl. 317—101)

This invention relates to circuit modules and more particularly to folded, compact modules formed of circuit packages and flexible conductor strips.

The complexity of modern electronic equipment and the necessity for providing as much circuitry as possible in a small volume has led to the development of various packaging techniques. One such development, which has come into wide use in the electronics industry, is the riser pin module. Such a module contains a number of printed circuit boards stacked in a parallel array. Each board contains a portion of the circuit components interconnected by printed circuitry. Riser pins are positioned around the edges of the boards and crimped or otherwise attached thereto to provide structural rigidity. Electrical interconnections between the printed circuit boards are made by soldering the printed conductors of various boards to a common riser pin. The riser pin package, after assembly, may be inserted into a back-plane, printed circuit or a similar receptacle for the extending riser pins.

The riser pin module has serious disadvantages which are overcome by the present invention. Since the riser pin package consists of printed circuit boards, no cross-overs are permitted on an individual board. Further, in order to provide electrical interconnections between the boards, the riser pins themselves must be used. When a riser pin is used for an interconnection, it is no longer available for electrical connection at the back-plane. Repair or replacement of a part is quite difficult and time-consuming as all the riser pins must be disconnected from the back-plane and the module then disassembled to gain access to a defective part. Upon the completion of repairs, the entire module must be reassembled and reconnected to the back-plane.

The present invention consists generally of two flexible conductor strips and packages containing electrical components which are connected to these strips. The strips are first arranged in the shape of a cross and component packages are connected to the four legs. A package which contains the circuitry and components for electrical continuity between the component packages is connected to the center of the cross. After the electrical connections have been made, the steps are folded to form a compact module, the module then being inserted into a back-plane by means of conductors extending from the folded assembly.

An object of the invention is to provide an electric circuit module that is relatively compact and readily assembled or disassembled.

Another object is to provide a circuit module containing a number of replaceable units, any one of which may be readily removed for repair or replacement.

Other objects and advantages of the invention will become apparent from the following description, claims, and drawings in which:

Figure 1:
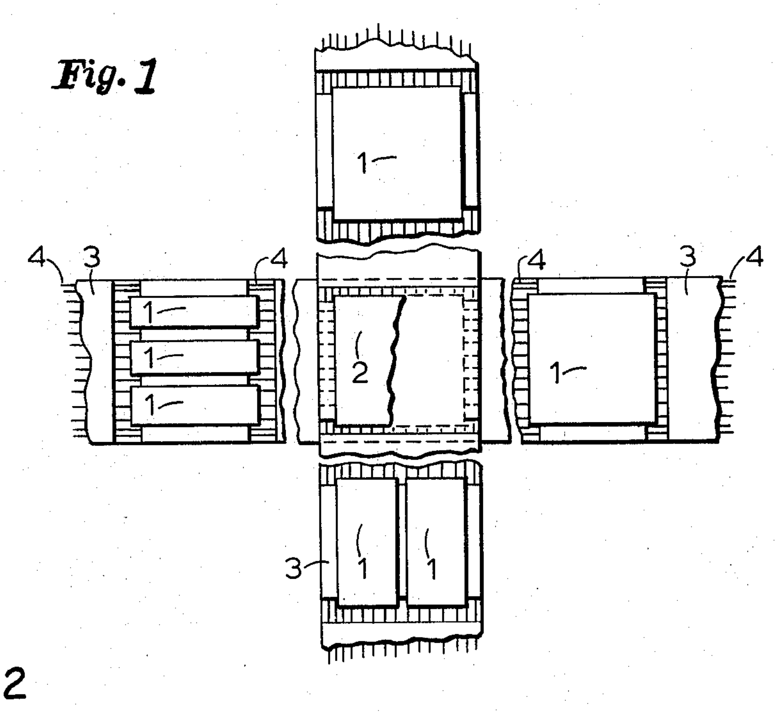
FIG. 1 shows the two conductor strips prior to folding with component packages connected thereto.

Referring to FIG. 1, two flexible conductor strips are shown in an overlying relationship thereby forming a cross. Each strip consists of a large number of fairly stiff conductive wires 4 contained within a covering layer of an insulating plastic 3. Commercially available .020" x .030" Phosphor bronze wire is a satisfactory material for the conductive wires as it is rigid enough to permit electrical connections to be made to it. A suitable material for the covering layer is adhesive backed Mylar polyester film, offered commercially, which possesses the necessary mechanical and electrical properties. The conductor strip must be flexible enough to permit it to be bent into various configurations and must be rigid enough to remain in a bent configuration. One technique of fabricating suitable flexible conductor strips is set forth below, it being understood that the present invention is not limited to the described materials or fabricating techniques.

Fifty rolls of .020" x .030" Phosphor bronze ribbon are positioned at one end of an aligning jig which holds these fifty ribbons on .050 inch centers. About 18 inches of ribbon is drawn from each roll and placed in the aligning jig. A strip of Mylar film having an adhesive back is placed over the wires. The flexible cable is then removed from the jig and a similar strip of Mylar film is placed on the other side. The plastic strips are pressed together insulatingly sandwiching the fifty conductors. The conductor strips are then sheared off from the rolls.

Packages 1 and 2 contain encapsulated circuit components which are hermetically sealed units having flexible or flying leads 5 extending therefrom. Suitable flying lead packages for use in the present invention, such as the Westinghouse functional electronic block package, are commercially available. These leads 5 may be joined in an appropriate way, such as by soldering or welding, to conductors 4. The plastic is first removed from the conductor strips in the region of these joints to make wires 4 accessible. This may be done by stripping the plastic away or by pre-punching the plastic strips before they are placed on the wires during manufacture.

Flying lead package 2 positioned at the center of the cross contains a cross-connecting circuit, such as a diode matrix, which provides electrical interconnection between the other flying lead packages. Depending on the design of the circuit, various types of interconnections may be used. For example, package 2 may contain only cross-wire connections or may contain both cross-wire connections and diode coupled connections. Circuit packages containing suitable cross-connecting circuitry and components are commercially available. If it is desired, the package 2 may be eliminated and the electrical connections made between proper conductors 4 where they overlie each other in the center of the cross. These connections may be made in any suitable manner such as by stripping adjacent overlying areas of plastic and soldering or welding the proper wires together.

Figure 2:
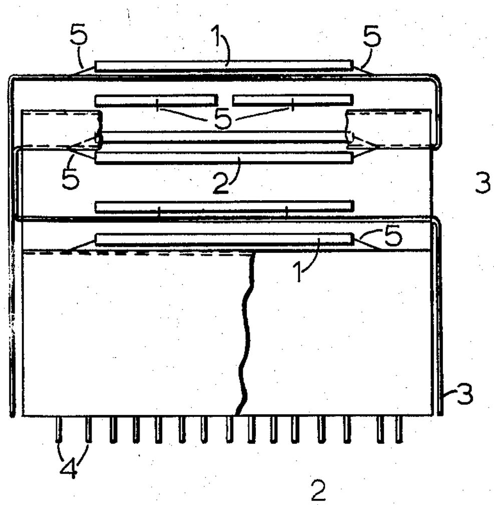
FIG. 2 shows a side elevation of the folded module.
Figure 3:
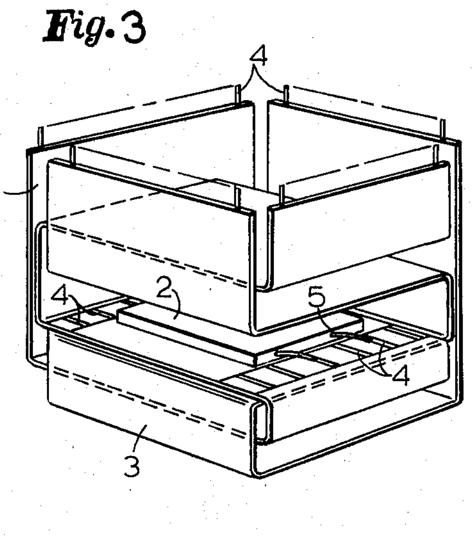
FIG. 3 shows a perspective view of the folded modules.

After the various electrical connections have been made (while the cross is unfolded as shown in FIG. 1), the cross is folded to form a compact module having a low vertical profile. The folded configuration is seen at FIGS. 2 and 3 in which both flexible strips are folded in a back and forth or zig-zag manner to produce an interleaved module. In the folded module as seen in FIGS. 2 and 3, the component packages have become aligned in a parallel stacked array. For clarity, only package 2 containing the electrical interconnections has been shown but the component packages 1 are arranged parallel to each other in a vertical track. Also, the four ends of the two flexible conductor strips have become positioned adjacent each other and all the leads 4 are able to be inserted into the receiving holes of a printed circuit board or a back-plane. Either before or after folding, the plastic material must be removed for the ends of the conductor strips to expose wires 4. Also, the exact lengths of the two strips may be slightly varied so that the tips of all the wires 4 are located in the same plane as seen in FIG. 3.

As is evident from FIGS. 2 and 3, the flexible lead strips may be folded with any desired degree of tightness, i.e., the folded module can be folded so tightly that the flying lead packages are as close together as possible in a parallel attached relation to form a module having a very low vertical profile. Design considerations, such as unwanted coupling effects and cooling problems, as well as the amount of space available for mounting, determine the tightness which the folding is to be done.

Figure 4:
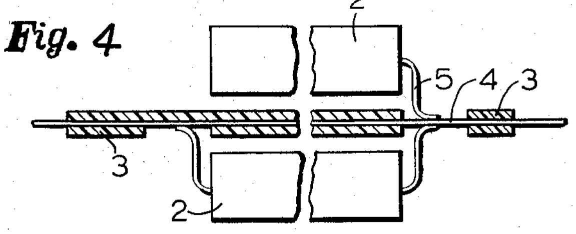
FIG. 4 shows a portion of conductor strip having two component packages connected thereto.

FIG. 4 illustrates the manner in which component packages may be connected to both sides of a flexible conductor strip. This expediency merely requires that plastic 3 be removed from both sides of the strip in the region where the electrical connections are to be made. At FIG. 2 two component packages 2 have been connected at the center region of the cross. If it were desired, additional packages could have been connected to one or more of the four legs but none have been shown for clarity.

While the novel features of the invention have been described as applied to certain preferred embodiments, it is understood that various changes and modifications may be made by one skilled in the art without departing from the spirit of the invention. It is the intention therefore to be limited only as indicated by the scope of the following claims.

I claim:

1. A circuit assembly comprising a plurality of conductor-containing strips intersecting in a common area, a plurality of component packages electrically connected to predetermined conductors of said strips, means electrically connecting predetermined conductors of one of said strips to predetermined conductors of another of said strips, predetermined ones of said strips being folded along first lines which are substantially parallel to each other, predetermined other ones of said strips being folded along second lines which are substantially normal to said first lines, and said strips being folded to place said component packages in stacked relation parallel to said common area.

2. A circuit module comprising first and second insulated conductor strips arranged in a cruciform configuration, the insulation removed from said strips in predetermined regions, a plurality of component packages having leads extending therefrom, said packages having their leads connected to said strips at said predetermined regions, and means electrically interconnecting said strips, said strips being folded in an interleaved manner so that said packages are arranged in a parallel relation to each other.

3. A circuit module comprising, in combination, first and second strips of electrical insulating material arranged in cruciform configuration and each containing a plurality of electrical conductors insulatingly embedded therein and extending longitudinally thereof, separate electrical component packages mounted on each strip having electrical leads extending therefrom and connected to certain of said conductors carried by the strips, said strips being folded alternately and in an interleaved manner over the intersecting area of the two strips so that said component packages are stacked one above the other over the intersecting area of the strips.

4. A circuit module comprising, in combination, first and second strips of electrical insulating material arranged in crossing relation to one another, each said strip having embedded therein a plurality of electrical conductors extending longitudinally of the strip in insulating relation to one another, an electrical component package occupying the area of the intersecting portions of the strips, additional electrical component packages mounted on other portions of the two strips, electrical leads extending from the component packages and connected through the insulating material of the strips to certain of the conductors embedded therein, said strips being folded alternately and in interleaved manner over their intersecting portions so that said component packages are arranged in stacked relation parallel to one another over the intersecting portions of the two strips.

References Cited by the Examiner

UNITED STATES PATENTS

| | | | |
|---|---|---|---|
| 2,997,521 | 8/1961 | Dahlgren | 174—68.5 |
| 3,113,248 | 12/1963 | Friedman | 317—101 |

OTHER REFERENCES

Electronics, November 5, 1960 (pp. 79 and 80).

JOHN F. BURNS, *Primary Examiner.*

DARRELL L. CLAY, *Examiner.*